(12) United States Patent
Reed (10) Patent No.: US 7,225,537 B2
(45) Date of Patent: *Jun. 5, 2007

(54) METHOD FOR MAKING MEMORY CARDS AND SIMILAR DEVICES USING ISOTROPIC THERMOSET MATERIALS WITH HIGH QUALITY EXTERIOR SURFACES

(75) Inventor: Paul Reed, Seattle, WA (US)

(73) Assignee: Cardxx, Inc., Englewood, CO (US)

( * ) Notice: Subject to any disclaimer, the term of this patent is extended or adjusted under 35 U.S.C. 154(b) by 140 days.

This patent is subject to a terminal disclaimer.

(21) Appl. No.: 11/044,329

(22) Filed: Jan. 27, 2005

(65) Prior Publication Data

US 2006/0162156 A1    Jul. 27, 2006

(51) Int. Cl.
*H05K 3/30* (2006.01)

(52) U.S. Cl. .......................... 29/841; 29/827; 235/488; 235/492

(58) Field of Classification Search ................ 29/827, 29/841; 235/488, 492
See application file for complete search history.

(56) References Cited

U.S. PATENT DOCUMENTS

| | | | |
|---|---|---|---|
| 4,641,418 A * | 2/1987 | Meddles ................ 264/272.17 |
| 4,792,843 A * | 12/1988 | Haghiri-Tehrani et al. .. 257/679 |
| 4,855,583 A | 8/1989 | Fraser et al. |
| 4,857,483 A * | 8/1989 | Steffen et al. ......... 264/272.17 |
| 5,134,773 A * | 8/1992 | LeMaire et al. ............... 29/827 |
| 5,272,374 A * | 12/1993 | Kodai et al. ................. 257/679 |
| 5,365,655 A * | 11/1994 | Rose ............................ 29/827 |
| 5,399,907 A * | 3/1995 | Nguyen et al. ............. 257/783 |
| 5,416,358 A * | 5/1995 | Ochi et al. .................... 257/666 |
| 5,417,905 A * | 5/1995 | Lemaire et al. ............. 264/139 |
| 5,598,032 A * | 1/1997 | Fidalgo ....................... 257/679 |
| 5,822,190 A * | 10/1998 | Iwasaki ....................... 361/737 |
| 5,955,021 A | 9/1999 | Tiffany, III |
| 6,025,054 A | 2/2000 | Tiffany, III |
| 6,049,463 A * | 4/2000 | O'Malley et al. .......... 361/760 |
| 6,214,155 B1 | 4/2001 | Leighton |
| 6,241,153 B1* | 6/2001 | Tiffany, III ................. 235/488 |
| 6,256,873 B1 | 7/2001 | Tiffany, III |
| 6,406,935 B2 | 6/2002 | Kayanakis et al. |
| 6,468,835 B1 | 10/2002 | Blanc et al. |
| 6,509,217 B1 | 1/2003 | Reddy |
| 6,514,367 B1 | 2/2003 | Leighton |
| 6,619,553 B1 | 9/2003 | Bobrov et al. |
| 6,851,618 B2 | 2/2005 | Halope |

\* cited by examiner

*Primary Examiner*—Carl J. Arbes
(74) *Attorney, Agent, or Firm*—Frommer, Lawrence & Haug LLP; John R. Lane (57) ABSTRACT

Memory Cards containing Integrated Circuits and other electronic components (e.g. resistors) in a variety of form factors having high quality external surfaces of polycarbonate, synthetic paper (e.g. Teslin), or other suitable material (e.g. PVC) can be made through use of injection molded thermoplastic material or thermosetting material that becomes the core layer of said Memory Cards and similar devices. The object of the invention is to provide the following properties to Memory Cards: rapid production cycle, high volume manufacturing throughput, security, electronics protection, better tamper resistance, durability, and highly reliable complex electronics encapsulation, achieved through a process utilizing low temperature and low pressure.

43 Claims, 12 Drawing Sheets

METHOD FOR MAKING MEMORY CARDS AND SIMILAR DEVICES USING ISOTROPIC THERMOSET MATERIALS WITH HIGH QUALITY EXTERIOR SURFACES

BACKGROUND OF THE INVENTION

In recent years, consumer electronic devices such as digital cameras, Personal Digital Assistants (PDAs), smart phones, and digital audio and video recorders have driven a strong market demand for removable data storage components. The electronics industry has responded to this demand with products known generically as "memory cards." A memory card usually contains one or more semiconductor memory chips within an industry-standard housing with dimensions that allow it to be used in conjunction with different devices from various manufacturers. Memory cards typically also have connectors on an external surface that allow electrical connections to the circuitry of consumer electronic devices. Examples of types of memory cards include PC Cards, MultiMedia Cards, CompactFlash Cards, and Secure Digital Cards. These devices are made in accordance with standards promulgated by trade associations such as the Personal Computer Memory Card International Association ("PCMCIA") and the MultiMedia Card Association ("MMCA").

Figure 1:
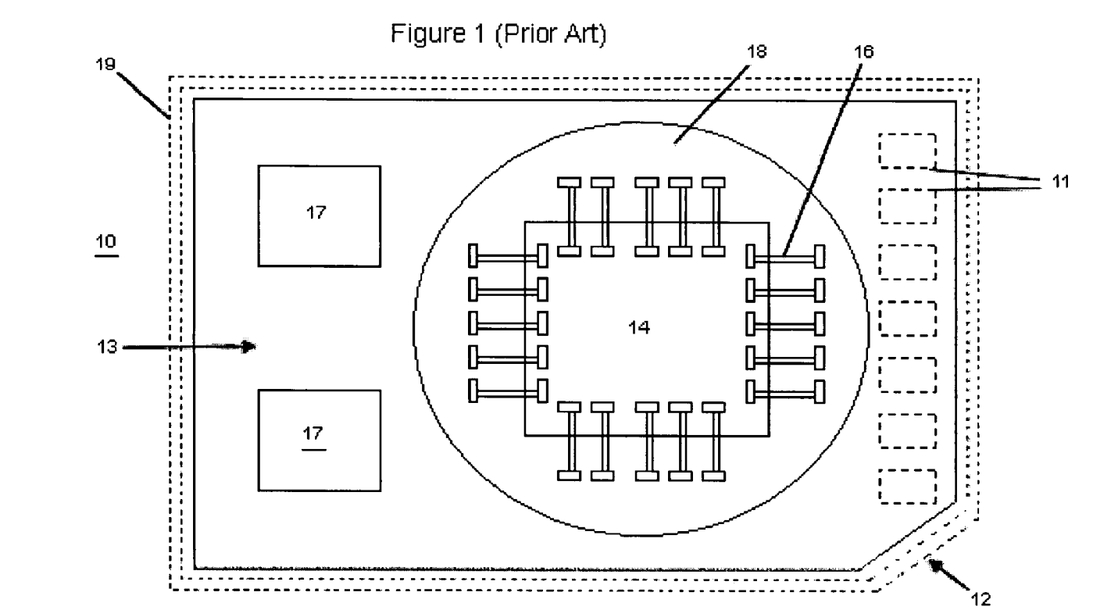
FIGS. 1–3 depict a prior art memory card in a top view cross-section, side view cross section, and bottom view, respectively.
Figure 2:
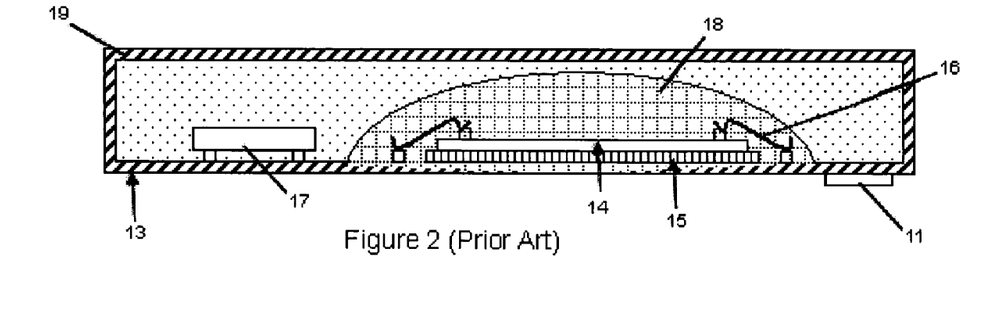
Figure 3:
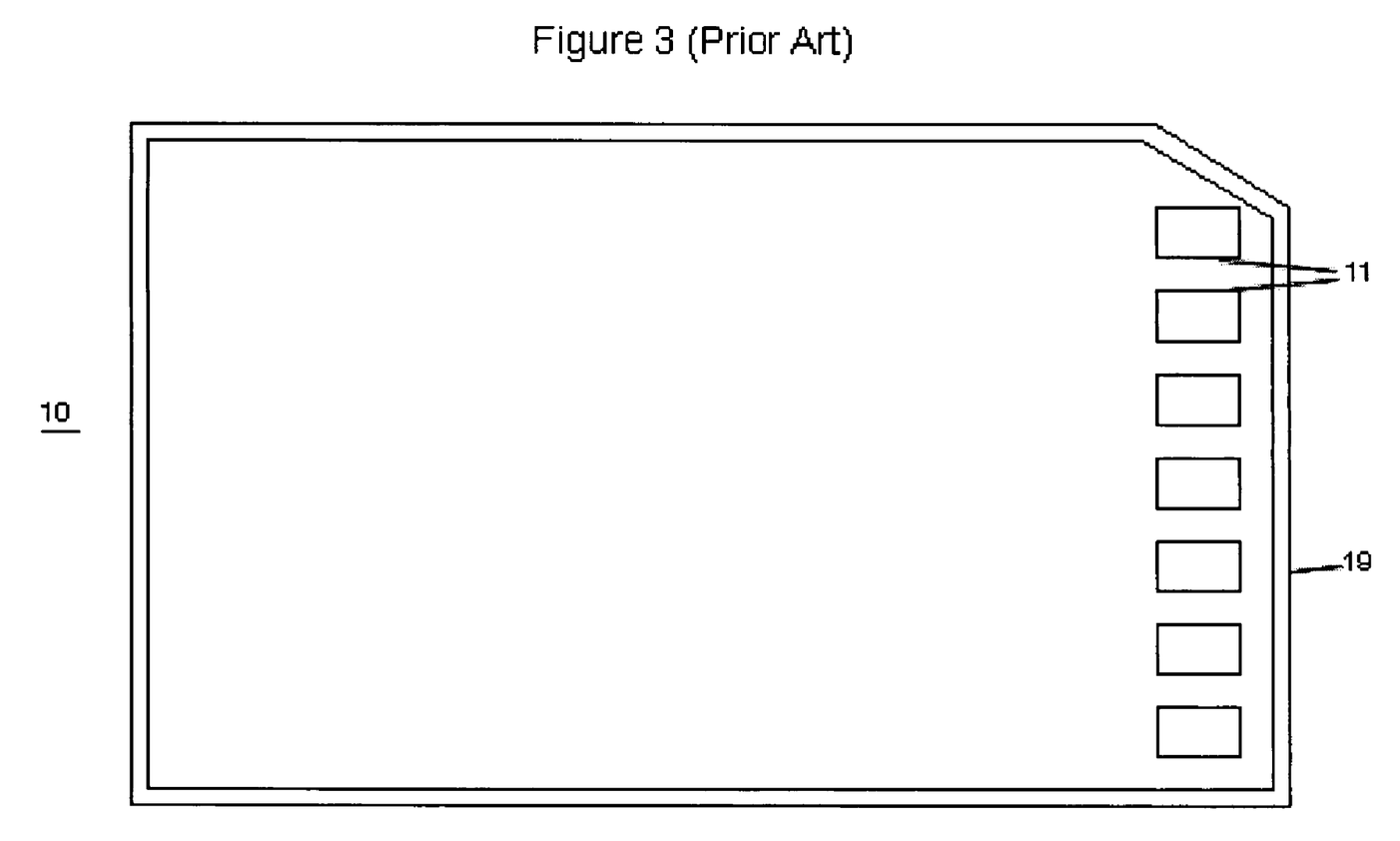

An exemplary memory card, namely, a MultiMedia Card ("MMC") 10, is illustrated in top view, cross-sectional side view, and bottom view in FIGS. 1–3, respectively. The MMC illustrated has standardized dimensions of 32 mm long, 24 mm wide, 1.4 mm thick, and typically includes a memory capacity of between 2 and 256 megabytes ("MB") of memory, which is accessed through seven contacts 11 located on the bottom surface of the MMC using, e.g., a standard serial port interface ("SPI") interface. A simple chamfer 12 on one corner of the MMC prevents incorrect insertion of the MMC into a connector in a host device.

The exemplary prior art MMC shown in FIGS. 1–3 comprises a rectangular substrate 13, such as a printed circuit board ("PCB"), and one or more semiconductor memory dies 14 or "chips" mounted on and electrically connected thereto using, e.g., a layer of adhesive 15 and conventional wire bonds 16, respectively. Surface mounted passive components, e.g., resistors, may also be mounted on and connected to substrate 13. Contacts 11 are connected through substrate 13 to memory circuits defined by foregoing components and serve as input-output terminals of card 10.

When the components have been mounted on and connected to the substrate 13, prior art methods included a step in which chip 14 is protectively encapsulated by a "glob-topping" process. This step was necessary due to the high-pressure, high-temperature injection of thermoplastic material that would occur at a later stage. The high-pressure injection and high temperature can damage a microchip and other small electronic components, particularly wire bonds. In the glob-topping step a glob of a viscous encapsulant is dispensed onto the top surface of the chip and is allowed to flow over the chip's sides to the surface of the substrate. The encapsulant is cured to form a protective envelope 18 over the chip. An external cover or housing 19 (shown by the dotted outline in FIG. 1) of thin sheet metal or plastic is installed over the substrate 13 assembly by embedding the top surface of the assembly in a bed of adhesive contained in the housing 19.

Prior art methods for making memory cards are, to a large degree, concerned with properly positioning and fixing electronic components, modules or assemblies inside the memory card. This concern is due to the fact that if the electronic components are not properly affixed they will be moved to random positions during injection of the thermoplastic material into a card-forming cavity. This is a particular problem in the prior art processes because the injection occurs under the influence of rather high pressures. Prior methods for making memory cards included the use of relatively large, mechanical holding devices having hard, sharply defined bodies for holding the electronic components in place during injection of thermoplastic materials. The use of such holding devices can limit the positioning options for the electronic components in the memory card. The positioning limitation also may cut down on the size and number of electronic components that can be placed in such memory cards. This limitation in turn limits the amount of memory that can be put into an MMC.

Additionally, due to differences in the coefficients of expansion of the materials used to make these relatively large holding devices—relative to the coefficient of expansion of the other elements of such cards—deformations often appear on the external surfaces of finished cards that contain such electronic component holding devices. That is to say that surface deformations can result from the mere presence of such holding members in the body of the card as it experiences different temperatures and pressures during its manufacture. Such deformations are, at best, unsightly; at worst, they may prevent the card from lying completely flat in the card-receiving receptacles in certain card reading machines.

Some memory card manufacturers have dealt with this problem by reducing the size of such holding devices or by using glues to securely position their electronic components in card-forming cavities during the thermoplastic injection process. The use of glues to secure electronic components has, however, resulted in another set of problems. These problems are due to the fact that most commercially available, fast-curing glues that are used to fix such electronic components in place are often characterized by their high degree of shrinkage. Moreover, relatively large volumes of glue are needed to fix the electronic components. Use of relatively large volumes of high-shrinkage glue tend to wrinkle and otherwise deform the region of the plastic sheet or layer to which such glues are applied. This wrinkling can transmit through the thin body of the memory card and cause the outer surface of the card to take on a local wave-like character. Beyond certain tolerances, these wave-like bends are unacceptable in the memory card industry because a deformed memory card will be inoperable in certain devices.

One additional limitation, which was touched on above, in the manufacture of prior art memory cards is that they are typically produced with prior art processes that involve the injection of filled epoxy resin or high-temperature, high-pressure thermoplastic injection into molded forms. In addition to the fact that a high-pressure, high-temperature injected material may stress or damage the electronic components of the card, it also takes a relatively long time to set and cool in the mold. Epoxy resins undergo a chemical reaction following injection, which can damage the electronic components of the memory card. What is needed is a method for producing memory cards that does not require providing a "glob-top" for memory die assemblies, with a rapid cure time and rapid manufacturing cycle time, and without the use of internal holding measures that could damage the memory card electronics.

SUMMARY OF THE INVENTION

It is therefore an object of this invention to provide a Memory Card or similar device with a thickness ranging from approximately 0.76 mm (the thickness of a conventional credit card) to approximately 5.0 mm that contains securely encapsulated Integrated Circuits and/or other electronics (e.g. a resistor) and with high quality exterior surfaces on which sophisticated graphics may be printed. The bottom surface of the Memory Card must include external contacts for electronic communication with other devices. It is additionally an object of this invention to securely encapsulate the electronics in a memory card using a low-pressure, low-temperature process in order to obviate the need for "glob-topping" the electronics. Removing the glob-topping process will save time in the processing of memory cards and will additionally provide valuable space inside of the memory card for additional memory or other electronic components. It is additionally an object of this invention to reduce manufacturing cycle time with a low-temperature process that improves production efficiency. A low-temperature process allows memory cards to be produced with less energy and enables production cycle time to be greatly reduced, thus improving manufacturing output.

This and other objects of the invention are achieved by providing a multi-layer Memory Card with an outer layer of material such as Teslin™ or other synthetic paper or suitable material (e.g. PVC, PC), with a core layer of injected polymeric material that securely encapsulates an Integrated Circuit (e.g. Multimedia card die assembly), and securely bonds to the outer layer of Teslin™ or other suitable material.

The use of low shrinkage glue to pedestal the electronic components above the bottom layer of the device facilitates an even flow and a complete encapsulation of the electronics by injected polymeric material. The mounds of low shrinkage glue positioned on the bottom layer of the device create and maintain a void space of approximately 0.1 to 0.15 mm to allow injected polymer to fill said void space and cover the top surface of the bottom layer and the bottom surface of the top layer, with no voids or pockets and with even and complete distribution of the polymer material in the void space below and above the electronics. Alternatively, the electronic components may be placed directly on a bottom mold without use of a bottom layer. In this way, the bottom of the electronic components comprises the bottom surface of the device.

Figure 6:
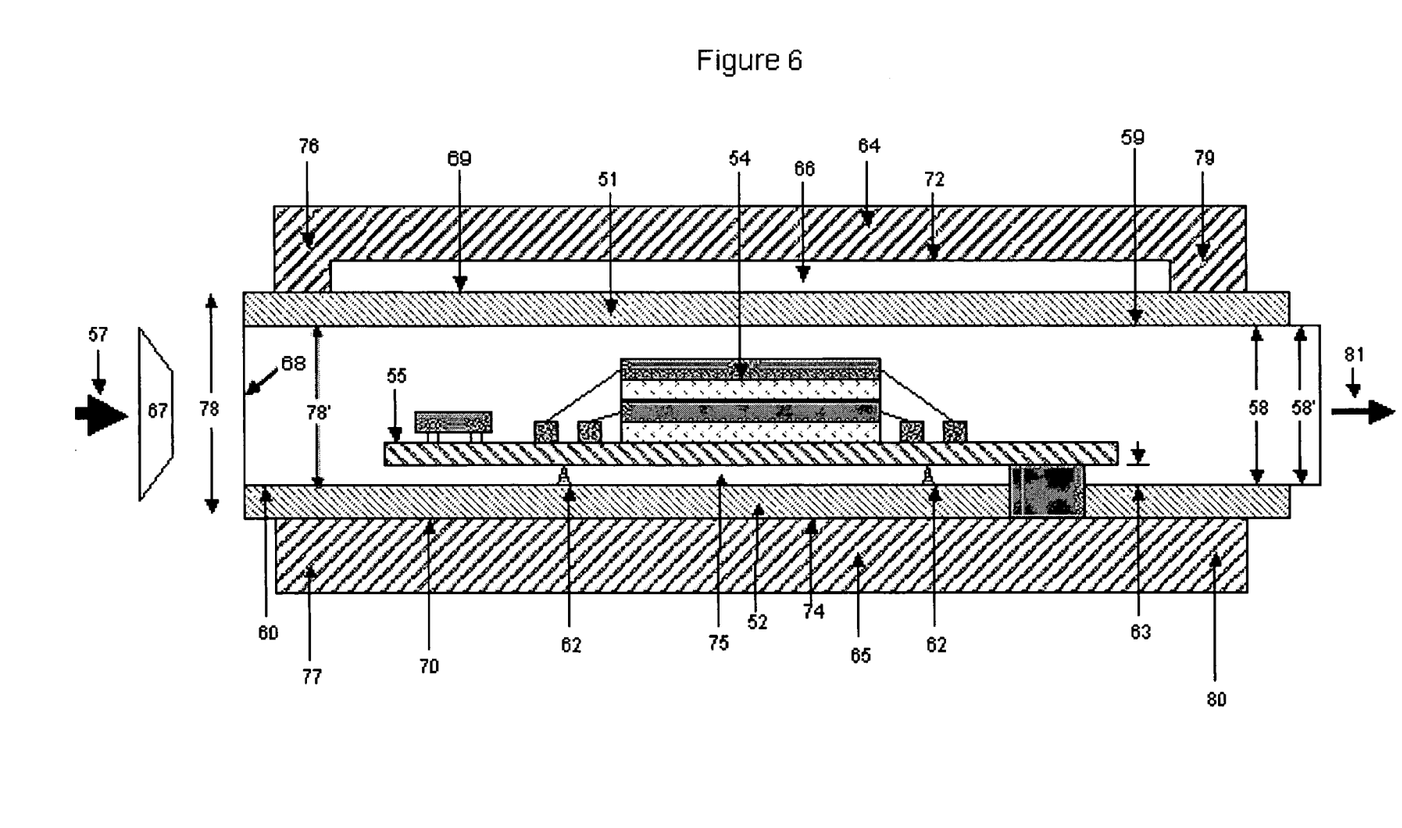
FIGS. 6 and 7 are cut-away side views of a mold tool set up for making a first preferred embodiment of an Memory Card of this patent disclosure wherein certain Memory Card components (e.g. Multimedia card die assembly) are shown before a liquid polymeric material is injected between the Memory Card's top and bottom layers (see FIG. 6 and after (see FIG. 7) the polymeric material is injected into a void space between the top and bottom layers and thereby filling said void space with a polymeric material and cold forming the top layer of the Memory Card to the contour of the top mold's Memory Card-forming cavity.

The object of the Teslin™, PVC, or other suitable material inlay sheet design is to enable the production of inlays, which are the electronic components, with multiple inlays per sheet. For example, FIG. 6 illustrates a 16×10 array of inlays (a total of 160 Memory Cards).

The inlays are produced on a single continuous sheet, which is then cut by a machine tool in a form that allows the Memory Card perimeter to be covered by the injected polymer.

DETAILED DESCRIPTION OF THE INVENTION

Figure 4A:
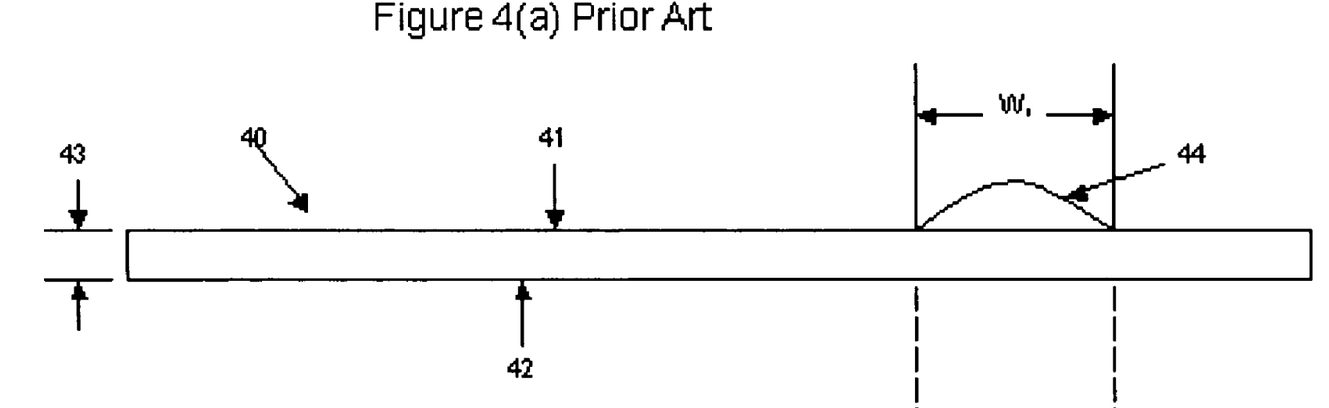
FIG. 4 is a cut-away side view of a layer or sheet of a synthetic paper (e.g. Teslin™) or plastic material (e.g., PVC) as used to make prior art Memory Cards. This view is shown before (FIG. 4(a)) and after (FIG. 4(b)) a drop of a prior art, "high shrinkage" glue is allowed to cure on that layer of synthetic paper or plastic material.
Figure 4B:
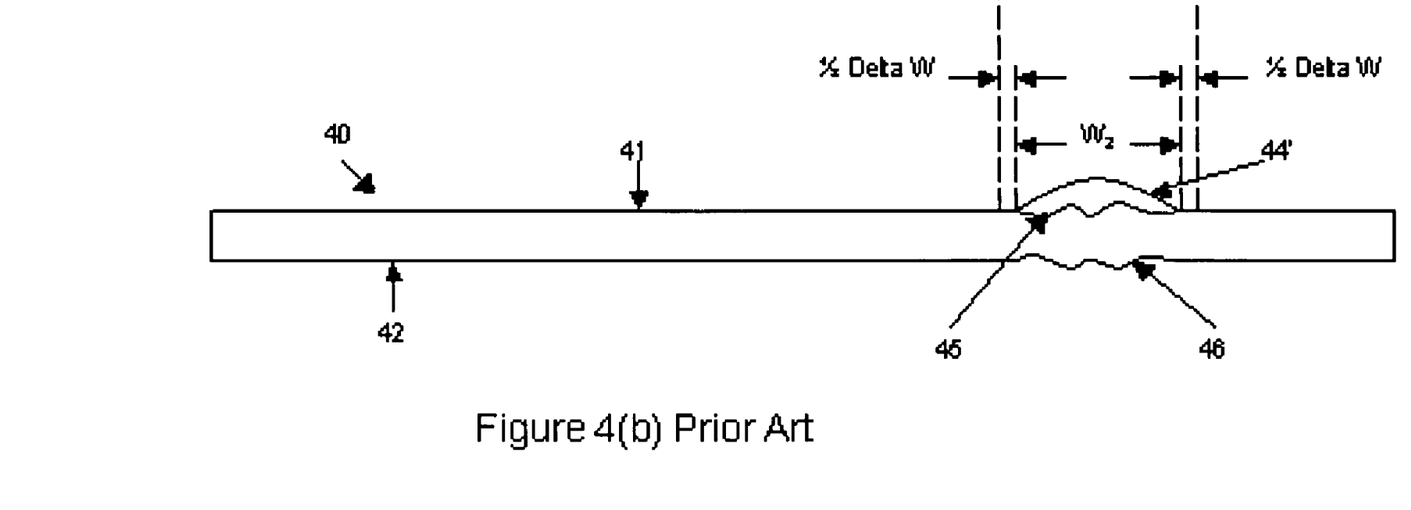

FIGS. 4(a) and 4(b) illustrate a problem involved with the prior art methods of making Memory Cards. FIG. 4(a) depicts, in cut-away cross section, a sheet or layer of a plastic material 40 (e.g., a sheet or layer of polyvinyl chloride, polyurethane, etc.) having a top surface 41 and a bottom surface 42. Such sheets will generally have a thickness 43 ranging from about 0.075 mm to about 0.25 mm. A mound, drop, or dollop of a liquid or semi-liquid, high shrinkage, glue 44 is depicted as being recently dispensed on the top surface 41 of the plastic sheet 40 shown in FIG. 4(a). The mound of recently dispensed glue 44 depicted in FIG. 4(a) is shown having an initial width $W_1$. FIG. 4(b) shows (in exaggerated form) the results of curing the mound of glue 44 shown in FIG. 4(b) to a smaller mound of cured glue 44'. The width $W_2$ of the mound of cured glue 44' depicted in FIG. 4(b) is considerably less than the width $W_1$ of the mound of the newly laid liquid or semi-liquid glue 44 in FIG. 4(b). For the sake of simplicity, the decrease or shrinkage from the original width $W_1$ to $W_2$ (i.e., $\Delta W$) of the mound of newly dispensed, high shrinkage glue is represented in FIG. 4(B) by the dimensions "½ $\Delta W$," on the left side of the mound of and a comparable "½ $\Delta W$" on the right side of said mound of cured glue 44'. Such curing is also depicted by a decrease in the volume of the original mound of glue 44. For example, this decrease in volume may be as much as 20 to 30 percent in many high shrinkage glues.

As previously noted the concept of a "high shrinkage" glue versus a "low shrinkage" glue also can be addressed in terms of the decrease in volume of a cured glue relative to the volume of that glue in its newly laid state.

The curing process associated with high shrinkage glues causes the mound of glue 44 depicted in FIG. 4(*a*) to shrink from an initial size which can be thought of as having an initial width $W_1$ (wherein the mound of glue is in a semi-liquid or tacky state) to a final width $W_2$ (wherein the cured glue 44' is in a substantially solid state) and that this high degree of shrinkage (e.g., greater than about 15 percent—and often as much as 20–30 percent) causes the top surface 41 of the layer or sheet of plastic material to "wrinkle up" or otherwise deform, e.g., form wrinkles 45 in FIG. 4(*b*). Such deforming actions create forces in the relatively thin layer (e.g., 0.075 to 0.25 mm thick) of plastic material 40. These forces are transmitted to the bottom surface 42 of that layer of plastic material 40. These transmitted forces, in turn, cause deformations 46, (curves, bends, waves, ripples, wrinkles, etc.), in the bottom surface 42 of the plastic layer 40. Any such deviations from a flat, smooth surface are regarded as highly undesirable deformities by the Memory Card industry and, hence, must be minimized to the fullest extent possible. Achievement of Memory Card surfaces having no such waves, bends, wrinkles, or other imperfections is one of the primary objects of the processes of this patent disclosure.

Figure 5:
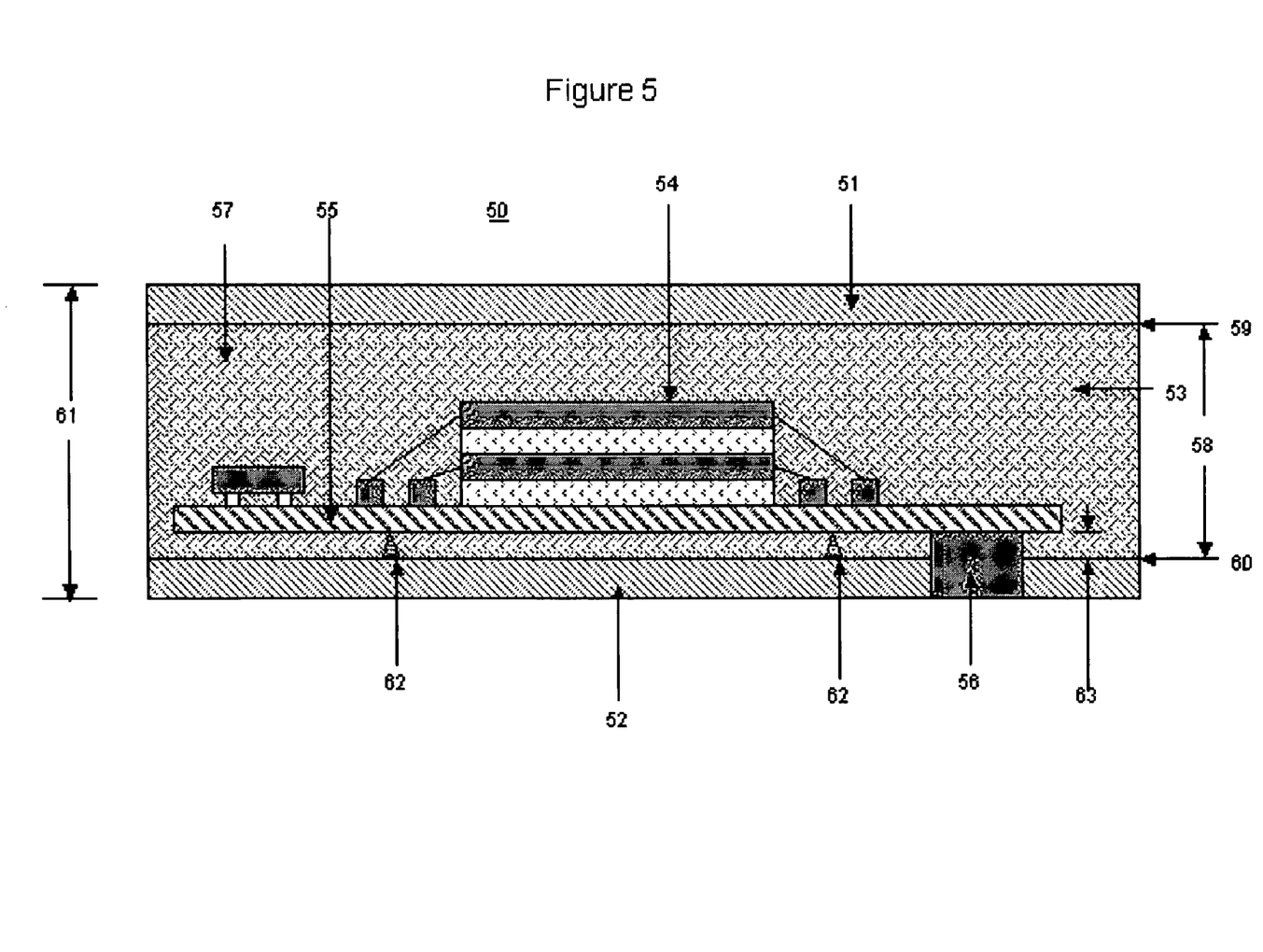
FIG. 5 is a cut-away side view of a Memory Card made according to the teachings of this patent disclosure.

FIG. 5 depicts a cut-away side view of a Memory Card 50 made according to the teachings of this patent disclosure. In its finished form, such a Memory Card 50 will be comprised of a top layer 51, a bottom layer 52, and a center or core layer 53 in which the Memory Card's electronic components (e.g. Multimedia die assembly 54 that includes a substrate 55 and contact pads 56, etc.) are embedded in a thermosetting polymeric material 57 (e.g., an initially liquid or semi-liquid thermosetting resin) that, upon curing, constitutes the center or core layer 53 of finished Memory Card 50. The thermosetting material 57 that eventually becomes the core layer 53 of Memory Card 50 is injected into the void space between the top layer 51 and bottom layer 52.

The void space is of height 58 and extends from one side of the card to the other. As described herein above, prior art methods of making memory cards involved injection of epoxy resins that chemically reacted to solidify and form the body of a memory card. These reactions are potentially dangerous to sensitive electronic components such as a microprocessor. Alternatively, prior art methods involved high-pressure injection of a high-temperature thermoplastic material. The high-pressure and temperature of prior art methods of injection is also dangerous for electronic components, which is why "glob-topping" to protect the electronic components is common practice when using the prior art methods. The configuration of the electronic components shown in FIG. 5, which does not include a protective "glob-top," would not be usable with either epoxy resins or high-pressure injected high-temperature thermoplastic materials. Lastly, both epoxy resins and high-temperature thermoplastics when injected into a mold take a considerable amount of time to cure. The lengthy curing and cooling times required when using high-temperature thermoplastics and high-pressure injection greatly slows the process of producing devices.

For these reasons the injected polymeric material 57 provides significant advantages by being injected under the relatively cold, low pressure forming conditions employed in applicant's process.

In any case, such thermosetting polymeric materials will be injected into, and fill, the void space 58 defined between the inside surface 59 of the top layer 51 and the inside surface 60 of the bottom layer 52. Upon curing, the polymeric material 57 of the core layer 53 should bond or otherwise adhere to both the inside surface 59 of the top layer 51 and the inside surface 60 of the bottom layer 52 to produce a unified Memory Card body. Such adherence can be aided by treating the inside surfaces 59 and 60 of the top and bottom layers in any one of several ways. For example, bonding agents known to this art (e.g. chloro-polyolefins) may be employed to enhance bonding between the core layer-forming thermoset material and the material(s) from which the top and bottom layers are made (e.g., Teslin, PVC). By way of example only, Minnesota Mining and Manufacturing's base primer product 4475 RTM can be used for this bond enhancing purpose, especially when the top or bottom layer material is PVC. Other treatments that can be applied to the inside surfaces of the top and/or bottom layers could include plasma corona treatments and acid etching.

The Memory Card's thickness 61 is defined by placement of the mold faces (not shown in FIG. 5) as the thermoset material is injected into the void space 58 as part of the cold, low pressure forming process of this patent disclosure. In effect, the injection of the thermoset material into the void space 58 between the top and bottom layers fills any portion of that void space 58 that is not otherwise occupied by the electronic components or by the mound(s) of low shrinkage glue 62 upon which the electronic components are placed.

Next, it should be noted that the Memory Card's electronic components (e.g., Multimedia die assembly substrate 55, Memory chip 54, etc.) are preferably positioned above the inside surface 60 of the bottom layer 52 through use of one or more drops or dollops of applicant's low shrinkage glue 62. As described herein above, prior art methods of making memory cards did not employ glue to pedestal the electronic components of the memory card. This is due to the fact that the prior art methods involve injection of epoxy resins or high-pressure, high-temperature thermoplastic materials, both of which would damage the glue. Also, and more importantly, because the prior art methods involve injection of epoxy resins or high-pressure high temperature thermoplastic materials, the electronic components have to be "glob-topped" and it is therefore unnecessary to pedestal the electronics.

In applicant's method, the electronic components are most preferably placed on top of two or more mound(s) of glue 62, etc. in the manner generally suggested in FIG. 5 so that the incoming liquid or semi-liquid polymeric material will flow under such electronic components as well as immerse these components from above and from their sides. In other words, in the more preferred embodiments of this invention the mound(s) of glue 62 will serve as one or more "pedestal(s)" upon which the electronic components are placed so that the underside of the electronic components do not come into direct contact with the top surface 60 of the bottom layer 52, but rather are immersed in the incoming thermoplastic material 57. This design enables these electronic components to better resist any flexion and/or torsion forces the Memory Card may encounter upon either of its major outside surfaces or on any of its four outside edge surfaces. In some of the more preferred embodiments of this invention these electronic components (e.g., Memory chip 54) will be positioned by the glue at a distance 63 of from about 0.075 mm to about 0.13 mm above the inside surface 60 of the bottom layer 52.

Figure 7:
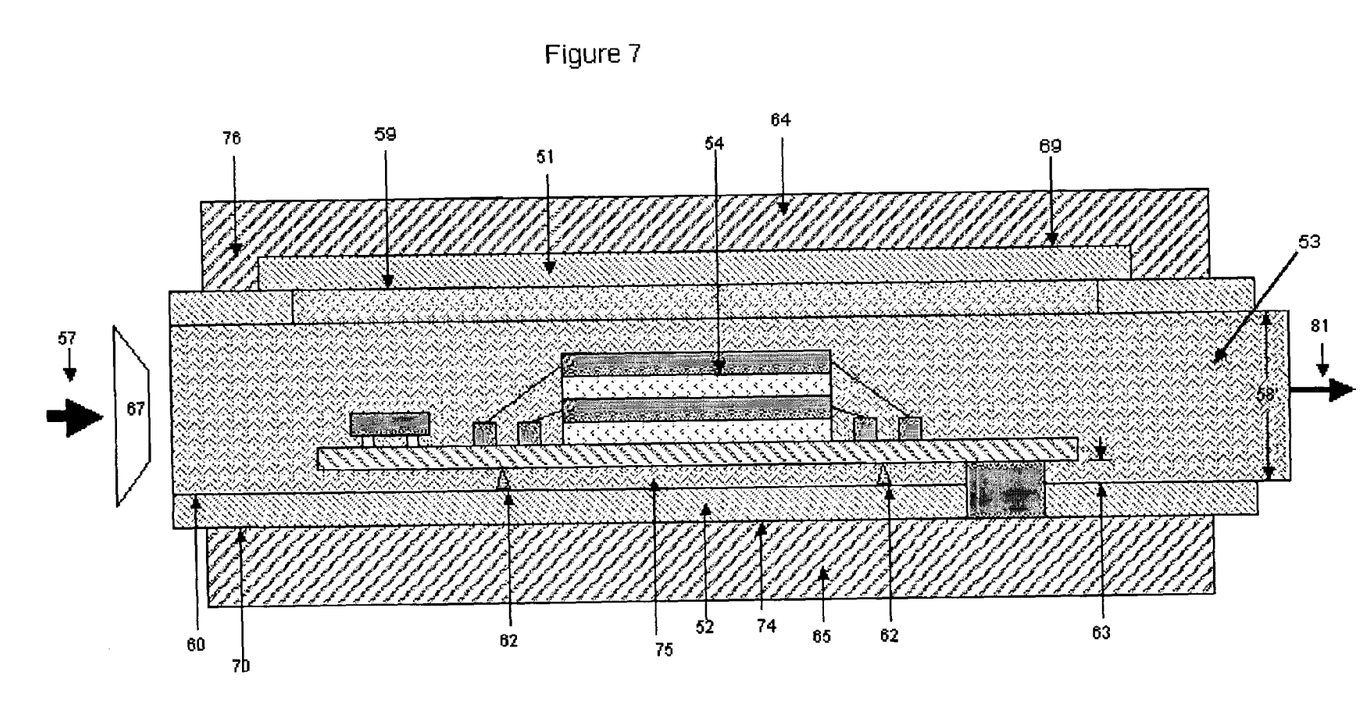

FIGS. 6 and 7 are contrasted to illustrate a first preferred embodiment of applicant's methods for making Memory Cards and similar devices. That is to say that FIG. 6 depicts a particularly preferred embodiment of this invention wherein the flat, top layer or sheet 51 of synthetic paper such as Teslin™ or plastic material 51 such as PVC is shown before it is cold, low pressure formed according to the teachings of this patent disclosure. In other words, FIG. 6 depicts the mold tool set-up just prior to the injection of the polymeric material and wherein a flat, top layer 51 (e.g., a flat sheet of PVC) is shown as it is initially placed under a Memory Card-forming cavity of the top mold 64 and a bottom layer 52 (e.g., another flat sheet of PVC) is shown as it is placed over a bottom mold 65. Again, however, in some less-preferred, but still viable, embodiments of applicant's processes the top layer 51 may be pre-molded or at least partially pre-molded, preferably, to the general contour of the Memory Card-forming cavity in the top mold 64.

By way of comparison, the bottom mold 65 has no cavity comparable to the cavity in the top mold 64. FIG. 7 depicts the effects of injecting the thermoset polymeric material 57 into the void space between the top and bottom layers 51 and 52. Thus, FIG. 7 shows the top layer 51 after it has been molded into a Memory Card-forming cavity 66 in the top mold 64.

Referring to FIG. 6, a nozzle 67 for injecting a liquid or semi-liquid, thermoplastic or thermosetting polymeric material 57 is shown being inserted into an orifice 68 that leads to the void space that is defined between the inside surface 59 of the top layer 51 and the inside surface 60 of the bottom layer 52. The distance between the top surface 69 of the top layer 51 and the bottom surface 70 of the bottom layer 52 is depicted by distance 78. The void space is shown extending from orifice 68 to the opposite end of the juxtaposed top layer 51 and bottom layer 52. In other words, in FIG. 6 a portion of the outside surface 69 of the top layer 51 is not yet in contact with the inside surface 72 of the Memory Card-forming cavity 66 of the top mold 64. By way of contrast, the outside surface 70 of the bottom layer 52 is shown in substantially flat, abutting contact with the inside surface 74 of the bottom mold 65.

In both FIGS. 6 and 7 the electronic components of the Memory Card (e.g., its substrate 55, memory chip 54, etc.) are shown positioned above the inside surface 60 of the bottom layer 52. By way of example only, such electrical components are shown pedestaled on two dabs or dollops 62 of applicant's low shrinkage glue. These glue pedestals hold the electronic components far enough above the inside surface 60 of the bottom layer 52 (e.g., from about 0.075 mm to about 0.13 mm) that the incoming thermoset polymeric material 57 can flow in to the region 75 under the electrical components as well as the regions above these electronic components. Again, such glue pedestal arrangements are preferred because the presence of the thermoset polymeric material under the electronic components tends to augment the protection of such electronic components against any forces or shocks that may be received by the outside surfaces (i.e., the outside of the bottom layer and/or the outside of the top surface) of the Memory Card.

In FIG. 6 the top mold 64 is shown having a cavity 66 which defines the surface contour of the top of the Memory Card to be formed during the injection process. To this end, the injection of the liquid or semi-liquid thermoset polymeric material 57 should be under pressure and temperature conditions such that the top layer 51 is cold, low pressure, formed into the cavity 66 of the top mold 64. FIG. 7 shows how the cold, low pressure forming process of this patent disclosure has in fact conformed the top surface 69 of the top layer 51 to the configuration of the Memory Card-forming cavity in the top mold 64. Again, the bottom surface 70 of the bottom layer 52 is shown in FIG. 7 molded against a substantially flat inside surface 74 of the bottom mold 65. This is a particularly preferred arrangement for making the Memory Cards of this patent disclosure.

In FIGS. 6 and 7, a front lip region 76 of the top mold 64 and a front lip region 77 of the bottom mold 65 are shown spaced apart from each other by a distance 78' that (taking into consideration the thickness of the top and bottom layers 51 and 52), in effect, defines the distance the width of the void space between top layer 51 and the bottom layer 52 at lip regions 76 and 77 of molds 64 and 65, respectively. This distance should be such that the thermoset polymeric material 57 can be injected into the void space over the entire length of the Memory Card. The counterpart distance 58 of the mold device setting on the right side of the system shown in FIG. 6 may differ from that of distance 78' on the left side. In any case the distance 58 should be such that the distance 58' defined between the inside surface 59 of the top layer 51 that passes through the rear lip 79 of the top mold 64 and the inside surface 60 of the bottom layer 52 that passes through the rear lip 80 of the bottom mold 65 is very small—but still finite. That is to say that this very small distance 58' should be large enough to allow gases 81 (e.g., air, polymeric ingredient reaction product gases, etc.) in the void space that originally existed between the top and bottom layers 51 and 52, respectively (see again, FIG. 6), and excess polymeric material to be exhausted from said void space, but still be small enough to hold the injection pressures used to inject the thermoset polymeric material 57. The distance 58' is preferably sized large enough to allow even thin layers of the liquid polymeric material 57 itself to be "squirted" or "flashed" out of the void space—and thus allowing all gases residing in, or created in, the void space to be expunged out of said void space and, indeed, out of the mold system itself. Thus, all such gases 81 are completely replaced by the incoming liquid thermoset material 57. This gas exhaust technique serves to prevent gas bubbles from forming in the body of the thermoset material 57 that eventually (i.e., upon curing of the thermoset material) comprises core layer 53 as shown in FIG. 7.

Figure 8:
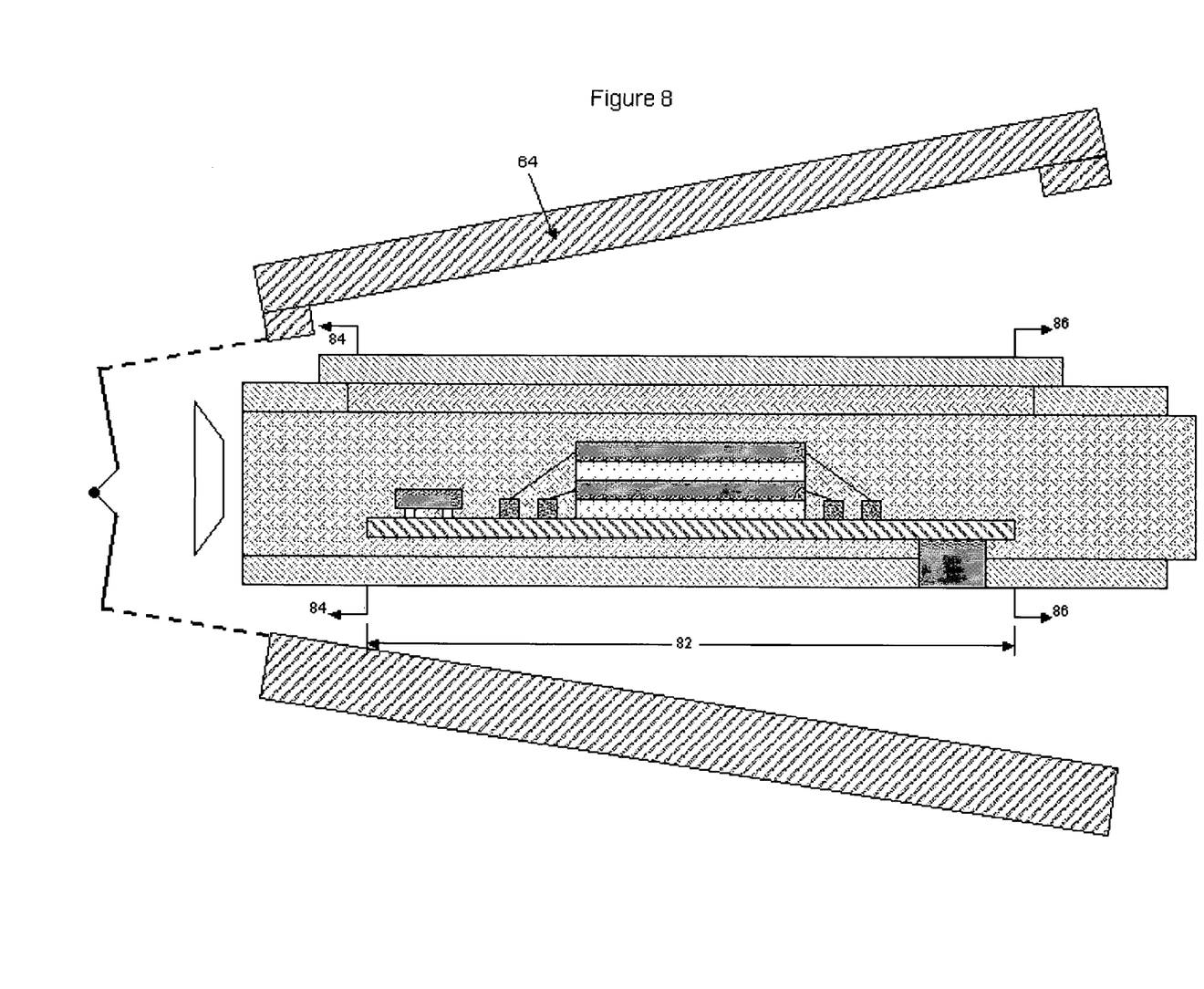
FIG. 8 is a cut-away view showing a mold tool being removed from a precursor Memory Card body formed by the system generally depicted in FIG. 7.

FIG. 8 shows a semi-finished or precursor Memory Card of the type shown in FIG. 7 being removed from a mold system. Section lines 84 and 86 respectively show where the left end and right end of the precursor Memory Card can be cut or trimmed away to create the sharp edges and precise dimensions of a finished Memory Card. In this case the distance 82 is about 32 millimeters.

Figure 9:
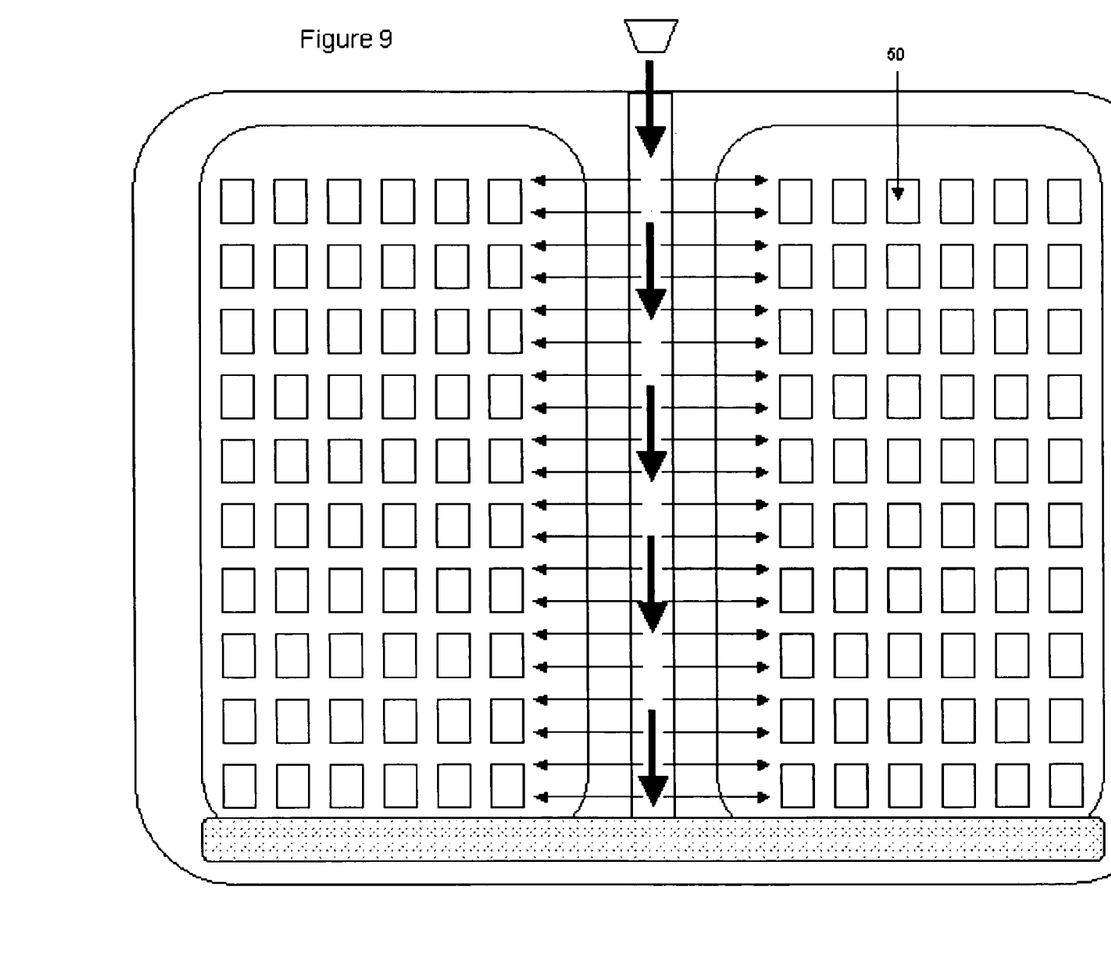
FIG. 9 depicts a mold tool system that is capable of making 160 Memory Cards (with dimensions of approximately 24 mm×32 mm) simultaneously.

FIG. 9 illustrates a molding procedure being carried out according to some of the preferred embodiments of this patent disclosure wherein 160 Memory Cards 50 with dimensions of approximately 24 mm×32 mm are being molded simultaneously.

Figure 10:
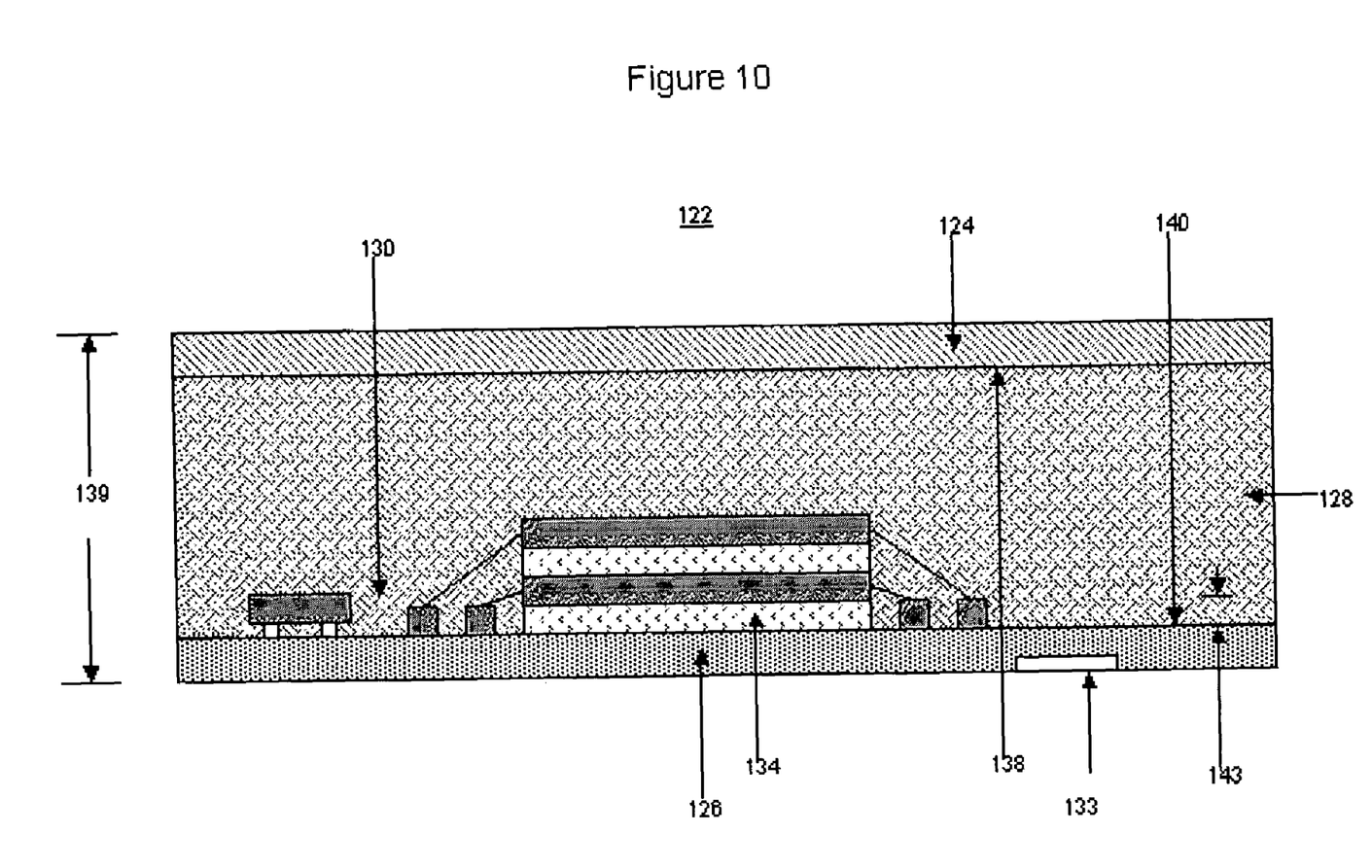
FIG. 10 is a cut-away side view of a finished Memory Card made without a separate bottom layer.

FIG. 10 illustrates a finished Memory Card 122 made using an alternate embodiment of the present invention in which an electronic component (in FIG. 10, the memory die assembly is comprised of substrate 126, memory die 134, external electrical contacts 133, and additional components) is used as the bottom layer, and no additional bottom layer is necessary.

Figure 11:
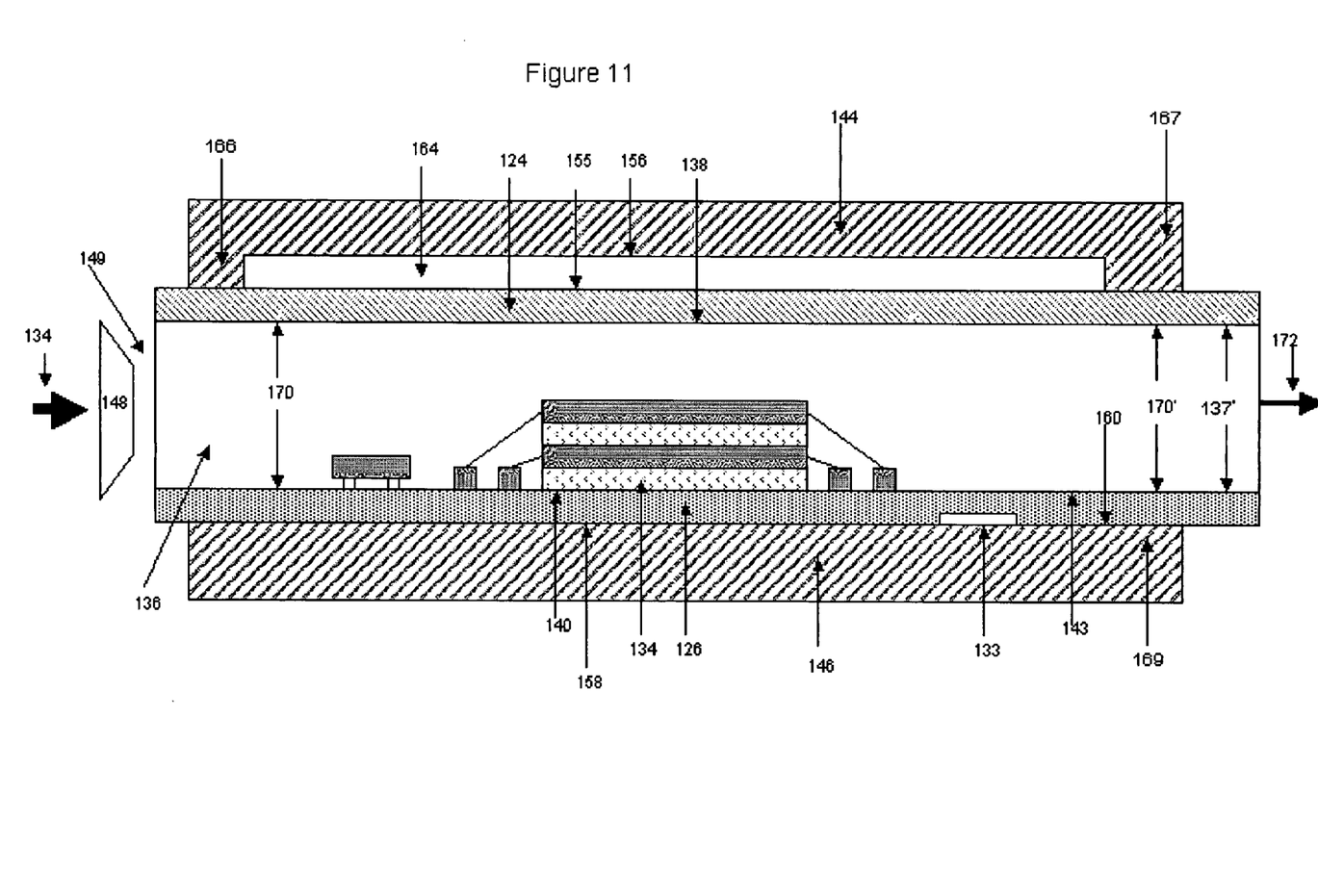
FIGS. 11 and 12 are cut-away side views of a mold tool set up for making a first preferred embodiment of an Memory Card of this patent disclosure wherein certain Memory Card components (e.g. Multimedia card die assembly) are shown before a liquid polymeric material is injected between the Memory Card's top layer and the electronic component. The polymeric material is injected into a void space between the top layer and the electronic components thereby filling the void space with a polymeric material and cold forming the top layer of the Memory Card to the contour of the top mold's Memory Card-forming cavity.
Figure 12:
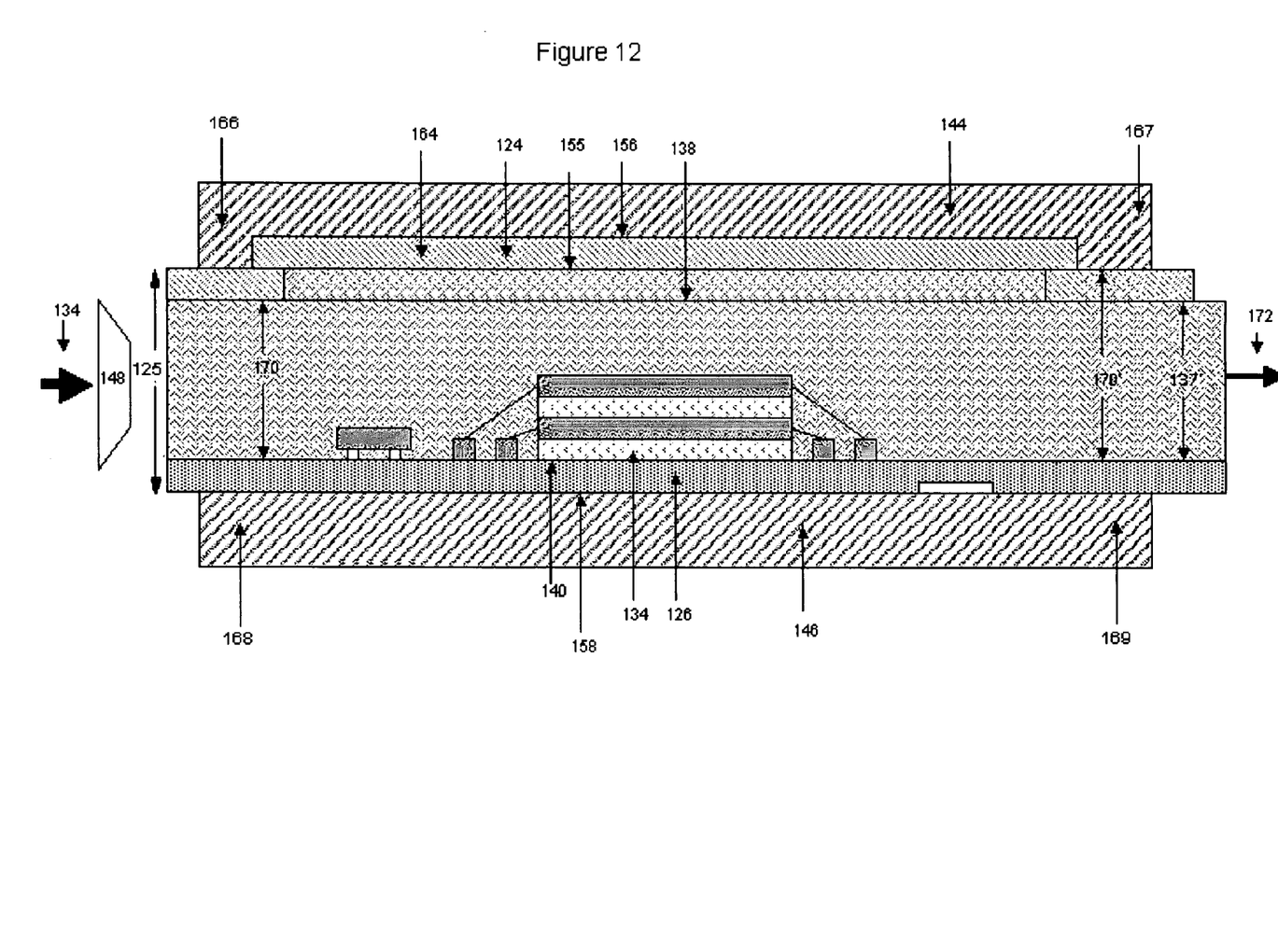

FIGS. 11 and 12 illustrate this second embodiment of applicant's methods for making Memory Cards and similar devices. That is to say that FIG. 11 depicts a particularly preferred embodiment of this invention wherein a flat, top layer or sheet 124 of synthetic paper such as Teslin™ or plastic material 124 such as PVC is shown before it is cold, low pressure formed according to the teachings of this patent disclosure. In other words, FIG. 11 depicts the mold tool set-up just prior to the injection of the polymeric material and wherein a flat, top layer 124 (e.g., a flat sheet of PVC) is shown as it is initially placed under an Memory Card-forming cavity of the top mold 144 and an electronic component comprised, for example, of a substrate 126, memory die 134, and external contacts 133, is shown as it is placed over a bottom mold 146. Again, however, in some less-preferred, but still viable, embodiments of applicant's processes the top layer 124 may be pre-molded or at least partially pre-molded, preferably, to the general contour of the Memory Card-forming cavity 164 in top mold 144.

By way of comparison, the bottom mold 146 has no cavity comparable to the cavity in the top mold 144. FIG. 12 depicts the effects of injecting the thermoset polymeric material into the void space 136 between the top layer 124 and the electronic component. FIG. 12 shows the top layer 124 after it has been molded into a Memory Card-forming cavity 164 in the top mold 144.

A nozzle 148 for injecting a liquid or semi-liquid, thermoplastic or thermosetting polymeric material 134 is shown being inserted into an orifice 149 that leads to the void space 136 that is defined between the inside surface 138 of the top layer 124 and the inside surface of the electronic component. The distance between the top surface 155 of the top layer 124 and the bottom surface 158 of the Memory Card is depicted by distance 125. The void space 136 is shown extending from the left end to the right end of the juxtaposed top layer 124 and the electronic component. In other words, in FIG. 1 the outside surface 155 of the top layer 124 is not yet in contact with the inside surface 156 of the Memory Card-forming cavity 164 of the top mold 144. By way of contrast, the outside surface 158 of the electronic component is shown in substantially flat, abutting contact with the inside surface 160 of the bottom mold 146.

In FIG. 11 the top mold 144 is shown having a cavity 164, which defines the surface contour of the top of the Memory Card to be formed during the injection process. To this end, the injection of the liquid or semi-liquid thermoset polymeric material 134 should be under pressure and temperature conditions such that the top layer 124 is cold, low pressure, formed into the cavity 164 of the top mold 144. FIG. 12 shows how the cold, low pressure forming process of this patent disclosure has in fact conformed the top surface 155 of the top layer 124 to the configuration of the Memory Card-forming cavity 164 in the top mold 144. Again, the bottom surface 158 of the electronic component is shown in FIG. 7 molded against a substantially flat inside surface 160 of the bottom mold 146.

In FIGS. 11 and 12 a front lip region 166 of the top mold 144 and a front lip region 168 of the bottom mold 146 are shown spaced apart from each other by a distance 170 that (taking into consideration the thickness of the top layer 124 and electronic component), in effect, defines the distance the width of the void space between the top layer 124 and the electronic component at these lip regions of the two molds 144 and 146. This distance 170 should be such that the thermoset polymeric material 134 can be injected into the void space 136 over the entire length of the Memory Card. The counterpart distance 170' of the mold device setting on the right side of the mold system may differ from that of distance 170 on the left side. In any case the distance 170' should be such that the distance 137 defined between the inside surface 138 of the top layer 124 that passes through the rear lip 167 of the top mold 144 and the inside surface of the electronic component that passes through the rear lip 169 of the bottom mold 146 is very small—but still finite. That is to say that this very small distance 137 should be large enough to allow gases 172 (e.g., air, polymeric ingredient reaction product gases, etc.) in the void space 136 that originally existed between the top layer 124 and the electronic component (see again, FIG. 11) and excess polymeric material to be exhausted from said void space 136, but still be small enough to hold the injection pressures used to inject the thermoset polymeric material. The distance 137 is preferably sized large enough to allow even thin layers of the liquid polymeric material 134 itself to be "squirted" or "flashed" out of the void space 136—and thus allowing all gases residing in, or created in, the void space 136 to be expunged out of said void space and, indeed, out of the mold system itself. Thus, all such gases 172 are completely replaced by the incoming liquid thermoset material 134. This gas exhaust technique serves to prevent gas bubbles from forming in the body of the thermoset material 134 that eventually (i.e., upon curing of the thermoset material) comprises the core layer 128 (FIG. 10).

Figure 13:
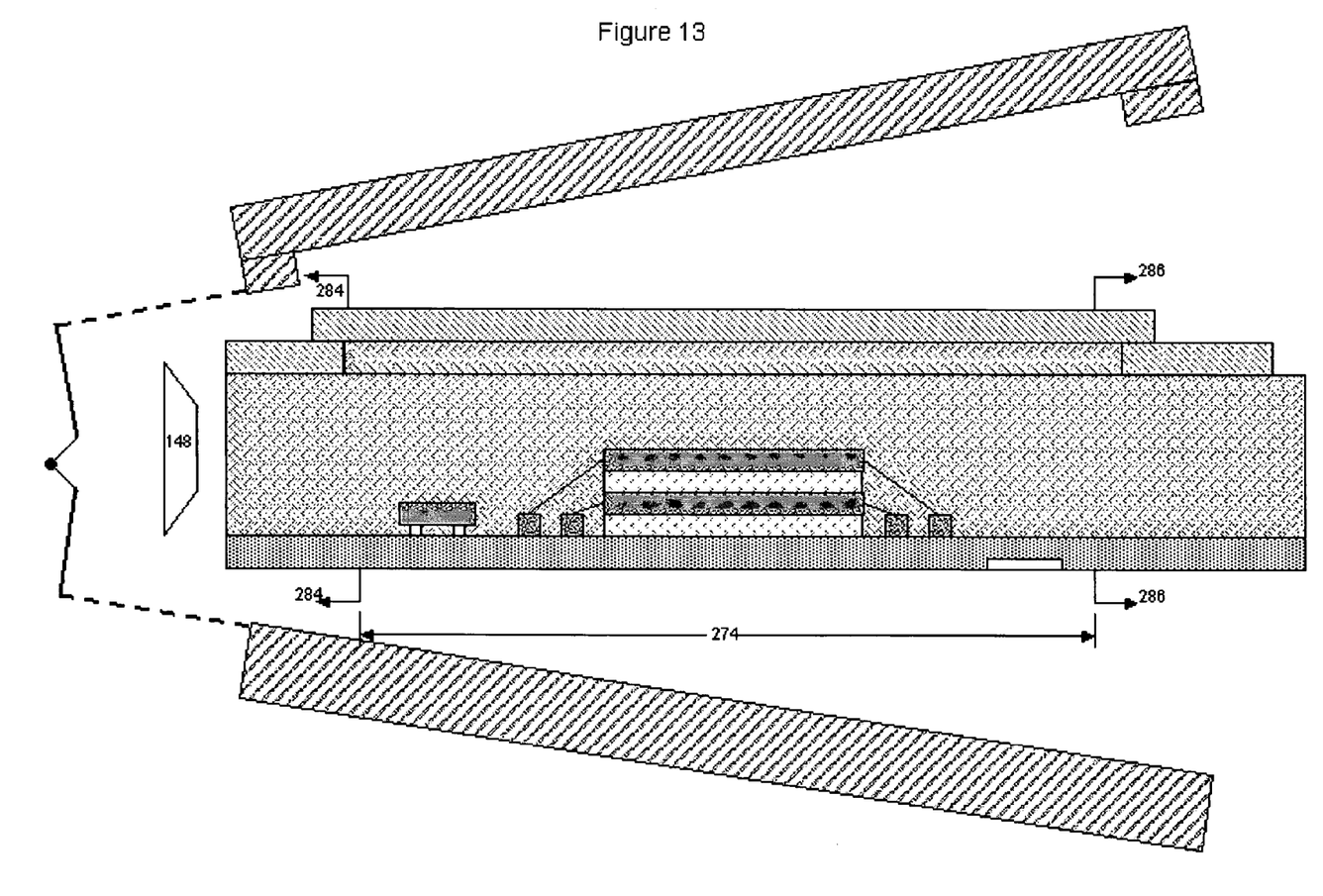
FIG. 13 is a cut-away view showing a mold tool being removed from a precursor Memory Card body formed by the system generally depicted in FIG. 12.

FIG. 13 shows a semi-finished or precursor Memory Card of the type shown in FIG. 12 being removed from a mold system. Section lines 284 and 286 respectively show how the left end and right end of the precursor Memory Card can be cut or trimmed away to create the sharp edges and precise dimensions of a finished Memory Card. In this case the distance 274 is about 32 millimeters.

While this invention has been described with respect to various specific examples and a spirit that is committed to the concept of the use of special glues and gluing procedures, it is to be understood that the herein described invention should be limited in scope only by the following claims.

What is claimed is:

1. A method for making a Memory Card or similar device comprising a top layer of synthetic paper or other suitable material, a bottom layer of synthetic paper or other suitable material, and a core layer in which electronic components reside, said method comprising:
    (1) constructing a bottom layer with precisely positioned openings for external electrical contacts;
    (2) placing at least one mound of low shrinkage glue on an inside surface of the bottom layer;
    (3) mounting an electronic component, having external electrical contacts, on the at least one mound of low shrinkage glue, thereby forming a bottom layer assembly, wherein the external electrical contacts are positioned in alignment with the openings in the bottom layer;
    (4) partially curing the at least one mound of low shrinkage glue, wherein the electronic component is secured in a stable position;
    (5) positioning the bottom layer assembly in a bottom mold;
    (6) positioning the top layer in a top mold;
    (7) closing the top mold to the bottom mold in a manner that creates a void space between the top layer and bottom layer;
    (8) injecting a thermosetting polymeric material into the void space at temperature and pressure conditions which are such that: (a) the electronic component is secured in position by the partially cured glue while the electronic component and partially cured glue are immersed in the thermosetting material, (b) gases and excess polymeric material are driven out of the void space, (c) the electronic component is encapsulated in the thermosetting polymeric material before the partially cured glue becomes completely cured, (d) the shrinking of the partially cured glue as it is fully cured brings the lower surface of the external electrical contacts flush with the bottom surface of the bottom layer, and (e) the thermosetting polymeric material bonds with both the top layer and the bottom layer to produce a unified precursor Memory Card body;

(9) removing the unified precursor Memory Card body from the mold device; and (10) trimming the precursor Memory Card or similar device to a desired dimension to produce a Memory Card.

2. The method of claim 1 wherein the electronic component does not come in physical contact with the bottom layer.

3. The method of claim 1 wherein the electronic component is positioned at least 0.01 mm above the bottom layer.

4. The method of claim 1 wherein the electronic component is an Integrated Circuit that is pedestaled on at least two mounds of glue that hold the Integrated Circuit at least 0.01 mm above the bottom layer.

5. The method of claim 1 wherein the low shrinkage glue is a cyanoacrylate adhesive type glue that is capable of at least partially curing in about 5 seconds or less.

6. The method of claim 1 wherein the low shrinkage glue is a UV-curable glue that is capable of at least partially curing in about 5 seconds or less.

7. The method of claim 1 wherein the low shrinkage glue is 10 percent cured in 3 seconds or less.

8. The method of claim 1 wherein the low shrinkage glue is 10 to 90 percent cured while it is immersed in the thermosetting material.

9. The method of claim 1 wherein the inside surface of the top layer and the inside surface of the bottom layer are treated to facilitate the creation of a strong bond between the top layer and the thermosetting material and the bottom layer and the thermosetting material.

10. The method of claim 1 wherein the inside surface of the top layer and the inside surface of the bottom layer are treated by coating each with a bonding agent.

11. The method of claim 1 wherein the inside surface of the top layer and the inside surface of the bottom layer are treated by a corona discharge process.

12. The method of claim 1 wherein the thermosetting material is injected into the void space at a pressure between ambient pressure and 500 psi.

13. The method of claim 1 wherein the thermosetting material is injected into the void space at a pressure between 80 and 120 psi.

14. The method of claim 1 wherein the thermosetting material is injected into the void space at a temperature between 56° F. and 120° F.

15. The method of claim 1 wherein the thermosetting material is injected into the void space between the top layer and the bottom layer at a temperature between 65° F. and 70° F.

16. The method of claim 1 wherein a film bearing alphanumeric/graphic information is applied to the inside surface of the top layer.

17. The method of claim 1 wherein a layer of opacity preventing material is applied to the inside surface of the top layer and the inside surface of the bottom layer.

18. The method of claim 1 wherein the electronic component is
  (a) a MultiMedia Card die assembly,
  (b) a Secure Digital card die assembly, or
  (c) another memory card die assembly,
  that is electrically connected to the external contacts.

19. The method of claim 1 wherein the top layer and the bottom layer are each formed from a flat sheet of polymeric material.

20. The method of claim 1 wherein the top layer is preformed with at least one Memory Card-forming cavity.

21. The method of claim 1 wherein the top layer is molded into a Memory Card-forming cavity of a top mold and the bottom layer is molded against a substantially flat surface of a bottom mold.

22. The method of claim 1 wherein the thermosetting material is a polyurethane.

23. The method of claim 1 wherein the thermosetting material is an epoxy.

24. The method of claim 1 wherein the thermosetting material is an unsaturated polyester.

25. The method of claim 1 wherein the void space is filled by a gate whose width is at least 25 percent of the width of an edge of a precursor Memory Card or similar device being serviced by said gate.

26. A method for making a Memory Card or similar device comprising a top layer, a core layer in which an electronic component is embedded and a bottom layer, said method comprising:

(1) constructing a bottom layer with precisely positioned openings for external electrical contacts;

(2) placing at least one mound of low shrinkage glue having a volume of less than 0.1 cc on an inside surface of the bottom layer;

(3) mounting an electronic component, having external electrical contacts, on the at least one mound of low shrinkage glue, thereby forming a bottom layer assembly, wherein the external electrical contacts are positioned in alignment with the openings in the bottom layer;

(4) curing the mound of low shrinkage glue from 10 percent to 90 percent of the total curing the glue will experience in a period of time less than 5 seconds, wherein the electronic component is secured in a stable position;

(5) positioning the bottom layer assembly in a bottom mold;

(6) positioning a top layer in a top mold;

(7) closing the top mold to the bottom mold in a manner that creates a void space between the top layer and bottom layer;

(8) injecting a thermosetting material into the void space at a temperature between 65° F. and 70° F. and at a pressure between 80 psi and 120 psi which are such that: (a) the electronic component is held in place by the mound of partially cured glue while the electronic component and mound of partially cured glue are immersed in the thermosetting material, (b) gases and excess polymeric material are driven out of the void space, (c) the electronic component is encapsulated in the thermosetting polymeric material before the partially cured glue becomes completely cured, (d) the shrinking of the partially cured glue as it is fully cured brings the lower surface of the external electrical contacts flush with the bottom surface of the bottom layer, and (d) the thermosetting polymeric material bonds with both the top layer and the bottom layer to produce a unified precursor Memory Card body;

(9) removing the unified precursor Memory Card or similar device body from the mold device; and (10) trimming the precursor Memory Card to a desired dimension to produce a Memory Card.

27. A method for making a Memory Card or similar device comprising a top layer of synthetic paper or other suitable material, and a bottom layer in which an electronic component resides, said method comprising:
- (1) constructing an electronic component, having external electrical contacts;
- (5) positioning the electronic component in a bottom mold;
- (6) positioning the top layer in a top mold;
- (7) closing the top mold to the bottom mold in a manner that creates a void space between the top layer and electronic component;
- (8) injecting a thermosetting polymeric material into the void space at temperature and pressure conditions which are such that: (a) the exposed electronic component is completely covered by the thermosetting material, thereby forming the bottom layer, (b) gases and excess polymeric material are driven out of the void space, (c) the electronic component is encapsulated in the thermosetting polymeric material, and (d) the thermosetting polymeric material bonds with both the top layer produce a unified precursor Memory Card body;
- (9) removing the unified precursor Memory Card body from the mold device; and
- (10) trimming the precursor Memory Card or similar device to a desired dimension to produce a Memory Card.

28. The method of claim 27 wherein the inside surface of the top layer is treated to facilitate the creation of a strong bond between the top layer and the thermosetting material.

29. The method of claim 27 wherein the inside surface of the top layer is treated by coating it with a bonding agent.

30. The method of claim 27 wherein the inside surface of the top layer is treated by a corona discharge process.

31. The method of claim 27 wherein the thermosetting material is injected into the void space at a pressure between ambient pressure and 500 psi.

32. The method of claim 27 wherein the thermosetting material is injected into the void space at a pressure between 80 and 120 psi.

33. The method of claim 27 wherein the thermosetting material is injected into the void space at a temperature between 56° F. and 120° F.

34. The method of claim 27 wherein the thermosetting material is injected into the void space between the top layer and the electronic component at a temperature between 65° F. and 70° F.

35. The method of claim 27 wherein a film bearing alphanumeric/graphic information is applied to the inside surface of the top layer.

36. The method of claim 27 wherein a layer of opacity preventing material is applied to the inside surface of the top layer.

37. The method of claim 27 wherein the electronic component is
- (a) a MultiMedia Card die assembly,
- (b) a Secure Digital card die assembly, or
- (c) another memory card die assembly, that is electrically connected to the external contacts.

38. The method of claim 27 wherein the top layer is formed from a flat sheet of polymeric material.

39. The method of claim 27 wherein the top layer is preformed with at least one Memory Card-forming cavity.

40. The method of claim 27 wherein the thermosetting material is a polyurethane.

41. The method of claim 27 wherein the thermosetting material is an epoxy.

42. The method of claim 27 wherein the thermosetting material is an unsaturated polyester.

43. The method of claim 27 wherein the void space is filled by a gate whose width is at least 25 percent of the width of an edge of a precursor Memory Card or similar device being serviced by said gate.

* * * * *